(12) United States Patent
Nishtala et al.

(10) Patent No.: US 6,519,747 B2
(45) Date of Patent: Feb. 11, 2003

(54) METHOD AND APPARATUS FOR DEFINING SIGNAL TIMING FOR AN INTEGRATED CIRCUIT DEVICE

(75) Inventors: Satyanarayana Nishtala, Cupertino, CA (US); Jayarama N. Shenoy, Fremont, CA (US); Tai-Yu Chou, Pleasanton, CA (US); Michael C. Freda, Morgan Hill, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 48 days.

(21) Appl. No.: 09/837,923

(22) Filed: Apr. 18, 2001

(65) Prior Publication Data

US 2002/0157072 A1 Oct. 24, 2002

(51) Int. Cl.[7] ................................................. G06F 9/45
(52) U.S. Cl. .................................................. 716/6; 716/3
(58) Field of Search ...................... 716/6, 7, 11; 703/19; 395/500

(56) References Cited

U.S. PATENT DOCUMENTS 5,507,029 A * 4/1996 Granato et al. ............. 395/500
6,086,621 A * 7/2000 Ginetti et al. ................. 703/19
6,230,304 B1 * 5/2001 Groeneveld et al. ........... 716/7
6,256,769 B1 * 7/2001 Tamarkin et al. .............. 716/6
6,317,865 B1 * 11/2001 Itoh ............................. 716/11

* cited by examiner

Primary Examiner—David Nelms
Assistant Examiner—Thinh T. Nguyen
(74) Attorney, Agent, or Firm—Edward J. Grundler; Park, Vaughan & Fleming LLP

(57) ABSTRACT

One embodiment of the present invention provides a system for defining signal timing for an integrated circuit device. The system operates by first creating a virtual timing reference plane for the integrated circuit device. A first signal line is then routed from a semiconductor die within the integrated circuit package to a first external connection of the integrated circuit package. Next, the system generates a first escape pattern for a first circuit trace on a printed circuit board from the first external connection to the virtual timing reference plane. This first escape pattern specifies a route from where the first external connection meets the printed circuit board to the virtual timing reference plane. Finally, the system establishes a first set of signal timings for a combination of the first signal line and the first circuit trace at the virtual timing reference plane.

21 Claims, 2 Drawing Sheets

METHOD AND APPARATUS FOR DEFINING SIGNAL TIMING FOR AN INTEGRATED CIRCUIT DEVICE

BACKGROUND

1. Field of the Invention

The present invention relates to integrated circuit devices. More specifically, the present invention relates to a method and an apparatus for defining signal timing characteristics for an integrated circuit device.

2. Related Art

Modern computing systems operate at ever-higher clock rates and present many challenges to circuit designers. At a clock rate of 1.6 gigahertz, for instance, the clock cycle time is 625 picoseconds. Since signals travel along the traces on a printed circuit board at approximately 180 picoseconds per inch, an extra half an inch of trace length consumes about 14.4 percent of the total cycle time at 1.6 gigahertz. The timing delay associated with extra signal trace length can severely impact the timing margins in a circuit at these high clock rates.

An integrated circuit device has many input/output connections and the signals at these connections are usually related in time. Typically, a designer of an integrated circuit specifies signal timing at external connections to the device. Bonding pads on the semiconductor die that is located within the integrated circuit package are different distances from these external connections. When signals traverse different length paths within the package, the signals arrive at the external connections skewed in time. In order to eliminate timing skew on related signals such as data lines, the signals are often deskewed within the package.

One method of deskewing the signals so they arrive at the external connections at the same time is to add extra trace length within the package through a process called tromboning. While effective at deskewing the signals, tromboning adversely affects density of routing on the package and increases the time required for designing the package and also increases package design complexity.

After the signals have exited the integrated circuit device's package, they are routed on the printed circuit board to other integrated circuits. It is common for these packages to have hundreds or even thousands of external connections. The printed circuit board designer has an equally perplexing problem routing the signals away from the integrated circuit package to other devices on the printed circuit board. The route that the printed circuit trace takes away from the external connection of the device is termed the "escape pattern."

In order to maintain the timing relationship among the related signals, the printed circuit board designer also resorts to deskewing methods such as tromboning. Deskewing on the printed circuit board also adversely affects the density of routing and design effort in the same way as deskewing within the device package.

For example, FIG. 1 illustrates integrated circuit device 102 coupled to integrated circuit device 104. Only two printed circuit traces, traces 120 and 122, are shown to prevent the diagram from being too cluttered. A practitioner of ordinary skill in the art will readily appreciate that there can be hundreds of printed circuit traces between integrated circuit device 102 and integrated circuit device 104. It is also typical for the printed circuit board to have several layers through which to route the various traces as well.

Die 106 within integrated circuit device 102 is coupled to the external connections, such as external connections 108 and 112, of the integrated circuit device package. The coupling within the package is typically multi-layer like the printed circuit board. Note that die 106 has bonding pads (not shown) for coupling the signals off of the die. In FIG. 1, external connection 108 is coupled to the die by trace 110 while external connection 112 is coupled to the die by trace 118.

External connection 112 is a greater distance from die 106 than is external connection 108. The package designer can compensate for the different distance by tromboning trace 110. This greatly reduces or eliminates the skew between the signals at external connections 108 and 112 such that the signals arrive at external connections 108 and 112 at the same time.

After exiting the integrated circuit device, the signals from external connections 108 and 112 are coupled to printed circuit traces 120 and 122, respectively. Printed circuit traces 120 and 122 route these signals to integrated circuit device 104. The couplings from plane 116 into integrated circuit device 104 are similar to the couplings to integrated circuit device 102 and are not described further.

The printed circuit board designer creates the escape pattern for the signals from external connections 208 and 212. Since it is likely that the path lengths for the various printed circuit traces are different, the printed circuit board designer can also compensate for the different lengths by tromboning as shown at trace 114. Note, however, that both couplings from die 106 to plane 116 have a section of tromboning. The signal passing through external connection 108 is coupled through traces 110 and 120, while the signal passing through external connection 112 passes through traces 118, 114, and 122.

While these couplings bring both signals to plane 116 without skew, both signals are delayed by the use of tromboning, which reduces the available timing margins.

What is needed is a method and apparatus for coupling signals away from an integrated circuit device, which minimizes the use of tromboning on both the package and the circuit board.

SUMMARY

One embodiment of the present invention provides a system for defining signal timing for an integrated circuit device. The system operates by first creating a virtual timing reference plane for the integrated circuit device. A first signal line is then routed from a semiconductor die within the integrated circuit package to a first external connection of the integrated circuit package. Next, the system generates a first escape pattern for a first circuit trace on a printed circuit board from the first external connection to the virtual timing reference plane. This first escape pattern specifies a route from where the first external connection meets the printed circuit board to the virtual timing reference plane. Finally, the system establishes a first set of signal timings for a combination of the first signal line and the first circuit trace at the virtual timing reference plane. Note that the methods embodied within this system can be performed manually by system designers or can be performed in part or in whole by a computing device programmed to perform the methods.

In one embodiment of the present invention, a second signal line is routed from the semiconductor die within the integrated circuit package to a second external connection of the integrated circuit package. A second signal on the second signal line has a timing relationship with a first signal on the first signal line. Next, the system generates a second escape pattern for a second circuit trace on the printed circuit board from the second external connection to the virtual timing reference plane. Finally, the system establishes a second set of signal timings for a combination of the second signal line and the second circuit trace at the virtual timing reference plane.

In one embodiment of the present invention, the second set of signal timings is substantially equal to the first set of signal timings.

In one embodiment of the present invention the combination of the first signal line and the first circuit trace is designed to minimize manual deskewing.

In one embodiment of the present invention, the combination of the second signal line and the second circuit trace is designed to minimize manual deskewing.

In one embodiment of the present invention, manual deskewing includes tromboning. Tromboning refers to the process of increasing a trace length by causing the trace to move back and forth across its intended path.

In one embodiment of the present invention, a first delay associated with the combination of the first signal line and the first circuit trace is substantially equal to a second delay associated with the combination of the second signal line and the second circuit trace.

In one embodiment of the present invention, the first delay and the second delay are minimized.

In one embodiment of the present invention, the virtual timing reference plane is a plane established outside of a boundary of the integrated circuit device through which connections to the integrated circuit device pass.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Virtual Timing Reference Plane

Figure 1:
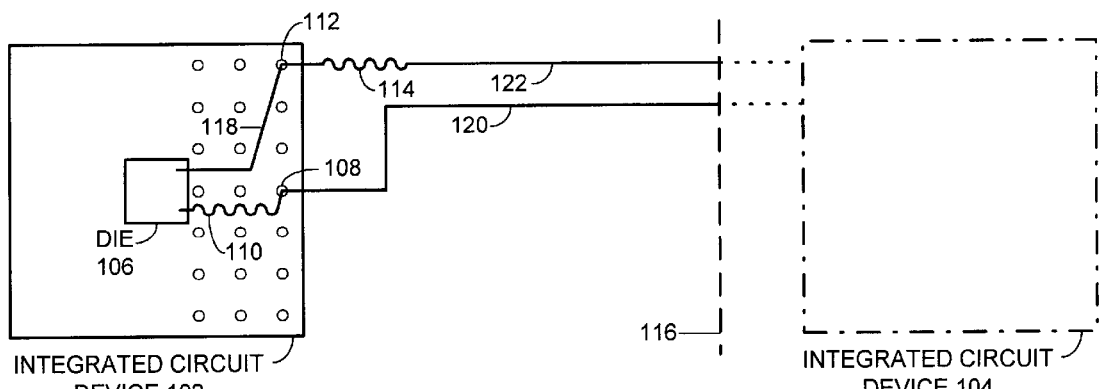
FIG. 1 illustrates integrated circuit device 102 coupled to integrated circuit device 104.
Figure 2:
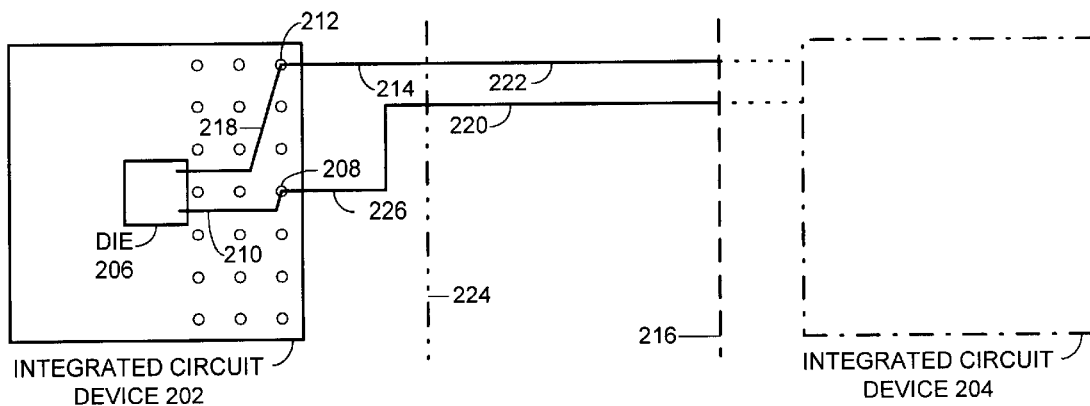
FIG. 2 illustrates virtual timing reference plane 224 in accordance with an embodiment of the present invention.

FIG. 2 illustrates virtual timing reference plane 224 in accordance with an embodiment of the present invention. Virtual timing reference plane 224 is established at a convenient distance outside the boundary of integrated circuit device 202. Input/output, signals from die 206 within integrated circuit device 202, for example the signals on printed circuit board traces 220 and 222, pass through virtual timing reference plane 224. The signals on traces 220 and 222 are coupled through plane 216 to integrated circuit device 204.

The signal on trace 220 is coupled through trace 226 to external connection 208 of integrated circuit device 202 while the signal on trace 222 is coupled through trace 214 to external connection 212 of integrated circuit device 202. External connection 208 is coupled to die 206 by trace 210 and external connection 212 is coupled to die 206 by trace 218. The package for integrated circuit device 202 and the printed circuit board are designed in concert to establish signal timings at virtual timing reference plane 224 such that related signals are not skewed from each other in time, while ensuring that no unnecessary delays are imposed on the signals.

To establish the necessary signal timings, the designers ensure that the delay on the combination of trace 210 and 226 is equal to the delay on the combination of trace 218 and 214. If needed, the designers can add deskewing, such as tromboning, to any of traces 210, 218, 226 and 214. However, deskewing should be minimized on each signal trace between die 206 and virtual timing reference plane 224 consistent with establishing the desired signal timings. It should be obvious to a person of ordinary skill in the art that the signal timings at virtual timing reference plane 224 can be established for any number of signals.

Establishing the Virtual Timing Reference Plane

Figure 3:
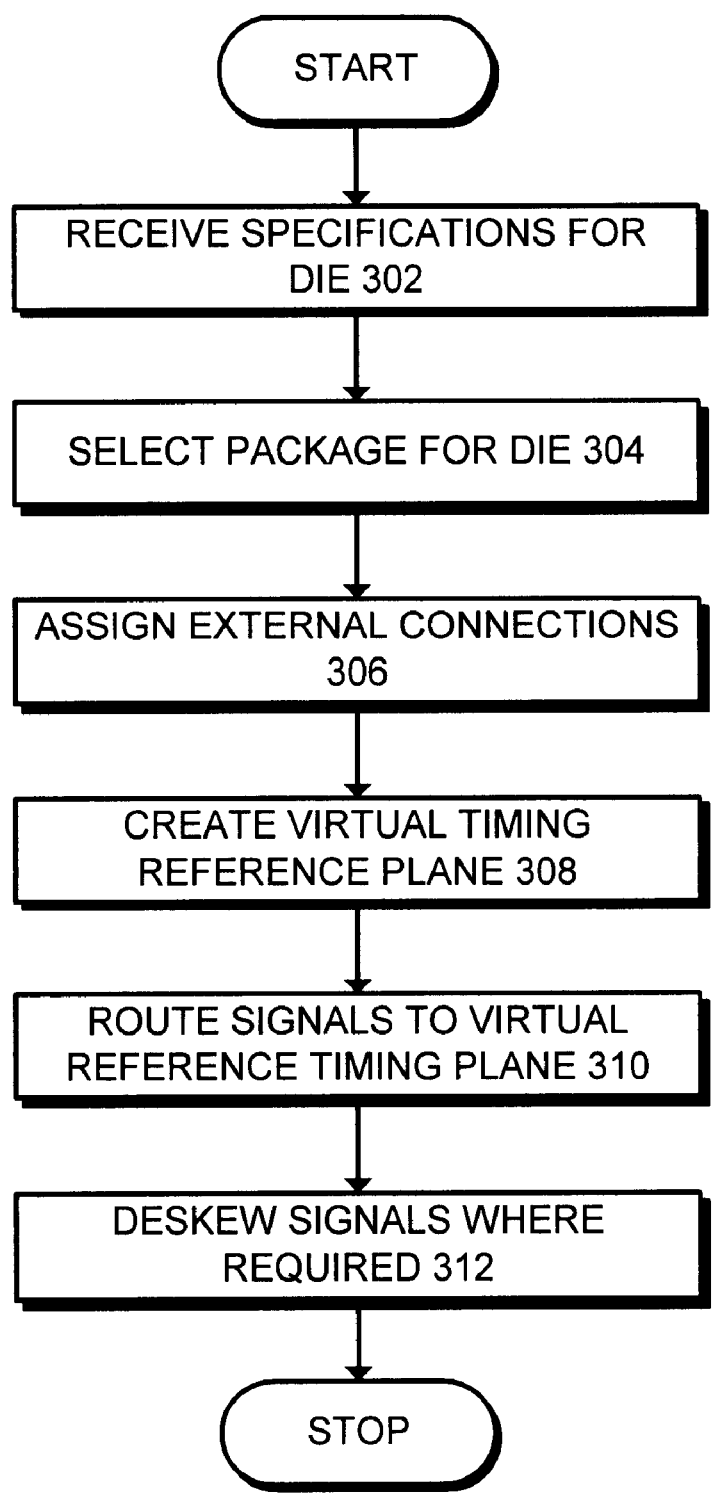
FIG. 3 is a flowchart illustrating the process of establishing virtual timing reference plane 224 in accordance with an embodiment of the present invention.

FIG. 3 is a flowchart illustrating the process of establishing virtual timing reference plane 224 in accordance with an embodiment of the present invention. The system starts when the specifications for a new integrated circuit die are received (step 302). A designer selects a package for the new die (step 304). Next, the designer assigns the external connections of the package to the input/output signals of the die (step 306).

The designer next establishes the virtual timing reference plane at a small distance outside the boundary of the integrated circuit device package (step 308). After the virtual timing reference plane has been established, the designer routes the signals from the external connections of the integrated circuit device to the virtual timing reference plane (step 310). Finally, the designer adds deskewing to the signal traces as needed to establish the desired signal timings at the virtual timing reference plane (step 312).

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for defining signal timing for an integrated circuit device, comprising:
   creating a virtual timing reference plane for the integrated circuit device;
   routing a first signal line from a semiconductor die within the integrated circuit device to a first external connection of the integrated circuit device;

generating a first escape pattern for a first circuit trace on a printed circuit board from the first external connection to the virtual timing reference plane, wherein the first escape pattern specifies a route from where the first external connection meets the printed circuit board to the virtual timing reference plane;

establishing a first set of circuit characteristics for a combination of the first signal line and the first circuit trace at the virtual timing reference plane;

routing a second signal line from the semiconductor die within the integrated circuit device to a second external connection of the integrated circuit device, wherein a second signal on the second signal line has a timing relationship with a first signal on the first signal line;

generating a second escape pattern for a second circuit trace on the printed circuit board from the second external connection to the virtual timing reference plane; and establishing a second set of circuit characteristics for a combination of the second signal line and the second circuit trace at the virtual timing reference plane;

wherein the second set of circuit characteristics is substantially equal to the first set of circuit characteristics thereby maintaining the timing relationship between the first signal line and the second signal line.

2. The method of claim 1, wherein the combination of the first signal line and the first circuit trace is designed to minimize manual deskewing.

3. The method of claim 2, wherein the combination of the second signal line and the second circuit trace is designed to minimize manual deskewing.

4. The method of claim 3, wherein manual deskewing includes tromboning.

5. The method of claim 3, wherein a first delay associated with the combination of the first signal line and the first circuit trace is substantially equal to a second delay associated with the combination of the second signal line and the second circuit trace.

6. The method of claim 5, wherein the first delay and the second delay are minimized.

7. The method of claim 1, wherein the virtual timing reference plane is a plane established outside of a boundary of the integrated circuit device through which all connections to the integrated circuit device must pass.

8. A computer-readable storage medium storing instructions that when executed by a computer cause the computer to perform a method for defining signal timing for an integrated circuit device, comprising:

creating a virtual timing reference plane for the integrated circuit device;

routing a first signal line from a semiconductor die within the integrated circuit device to a first external connection of the integrated circuit device;

generating a first escape pattern for a first circuit trace on a printed circuit board from the first external connection to the virtual timing reference plane, wherein the first escape pattern specifies a route from where the first external connection meets the printed circuit board to the virtual timing reference plane;

establishing a first set of circuit characteristics for a combination of the first signal line and the first circuit trace at the virtual timing reference plane;

routing a second signal line from the semiconductor die within the integrated circuit device to a second external connection of the integrated circuit device, wherein a second signal on the second signal line has a timing relationship with a first signal on the first signal line;

generating a second escape pattern for a second circuit trace on the printed circuit board from the second external connection to the virtual timing reference plane; and establishing a second set of circuit characteristics for a combination of the second signal line and the second circuit trace at the virtual timing reference plane;

wherein the second set of circuit characteristics is substantially equal to the first set of circuit characteristics thereby maintaining the timing relationship between the first signal line and the second signal line.

9. The computer-readable storage medium of claim 8, wherein the combination of the first signal line and the first circuit trace is designed to minimize manual deskewing.

10. The computer-readable storage medium of claim 9, wherein the combination of the second signal line and the second circuit trace is designed to minimize manual deskewing.

11. The computer-readable storage medium of claim 10, wherein manual deskewing includes tromboning.

12. The computer-readable storage medium of claim 10, wherein a first delay associated with the combination of the first signal line and the first circuit trace is substantially equal to a second delay associated with the combination of the second signal line and the second circuit trace.

13. The computer-readable storage medium of claim 12, wherein the first delay and the second delay are minimized.

14. The computer-readable storage medium of claim 8, wherein the virtual timing reference plane is a plane established outside of a boundary of the integrated circuit device through which all connections to the integrated circuit device must pass.

15. An apparatus that facilitates defining signal timing for an integrated circuit device, comprising:

a creating mechanism configured to create a virtual timing reference plane for the integrated circuit device;

a routing mechanism configured to route a first signal line from a semiconductor die within the integrated circuit device to a first external connection of the integrated circuit device;

a generating mechanism configured to generate a first escape pattern for a first circuit trace on a printed circuit board from the first external connection to the virtual timing reference plane, wherein the first escape pattern specifies a route from where the first external connection meets the printed circuit board to the virtual timing reference plane; and a characteristic establishing mechanism configured to establish a first set of circuit characteristics for a combination of the first signal line and the first circuit trace at the virtual timing reference plane;

wherein the routing mechanism is further configured to route a second signal line from the semiconductor die within the integrated circuit device to a second external connection of the integrated circuit device, wherein a second signal on the second signal line has a timing relationship with a first signal on the first signal line;

wherein the generating mechanism is further configured to generate a second escape pattern for a second circuit trace on the printed circuit board from the second external connection to the virtual timing reference plane;

wherein the characteristic establishing mechanism is further configured to establish a second set of circuit characteristics for a combination of the second signal line and the second circuit trace at the virtual timing reference plane; and wherein the second set of circuit characteristics is substantially equal to the first set of circuit characteristics.

16. The apparatus of claim 15, wherein the combination of the first signal line and the first circuit trace is designed to minimize manual deskewing.

17. The apparatus of claim 16, wherein the combination of the second signal line and the second circuit trace is designed to minimize manual deskewing.

18. The apparatus of claim 17, wherein manual deskewing includes tromboning.

19. The apparatus of claim 17, wherein a first delay associated with the combination of the first signal line and the first circuit trace is substantially equal to a second delay associated with the combination of the second signal line and the second circuit trace.

20. The apparatus of claim 19, wherein the first delay and the second delay are minimized.

21. The apparatus of claim 15, wherein the virtual timing reference plane is a plane established outside of a boundary of the integrated circuit device through which all connections to the integrated circuit device must pass.

* * * * *